(12) United States Patent
Ohsawa

(10) Patent No.: US 6,903,419 B2
(45) Date of Patent: Jun. 7, 2005

(54) SEMICONDUCTOR STORAGE DEVICE AND SEMICONDUCTOR INTEGRATED CIRCUIT

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/682,955

(22) Filed: Oct. 14, 2003

(65) Prior Publication Data

US 2004/0262679 A1 Dec. 30, 2004

(30) Foreign Application Priority Data

Jun. 30, 2003 (JP) ........................................ 2003-188539

(51) Int. Cl.⁷ .................... H01L 27/01; H01L 27/12; H01L 31/0392
(52) U.S. Cl. .................. 257/347; 257/348; 257/349; 257/350; 257/351
(58) Field of Search ................................ 257/347–351, 257/135, 263–267, 302, 319, 328–334

(56) References Cited

U.S. PATENT DOCUMENTS

2002/0034855 A1   3/2002   Horiguchi et al.
2002/0051378 A1   5/2002   Ohsawa
2002/0110018 A1   8/2002   Ohsawa

FOREIGN PATENT DOCUMENTS

| JP | 10-256560 | 9/1998 |
| JP | 10-326878 | 12/1998 |
| JP | 11-265990 | 9/1999 |
| JP | 2002-246571 | 8/2002 |
| JP | 2003-68877 | 3/2003 |

OTHER PUBLICATIONS

U.S. Appl. No. 10/682,955, filed Oct. 14, 2003, Ohsawa.
U.S. Appl. No. 10/854,403, filed May 14, 2004, Yamada et al.

*Primary Examiner*—Thien F Tran
(74) *Attorney, Agent, or Firm*—Oblon, Spivak, McClelland, Maier & Neustadt, P.C.

(57) ABSTRACT

A semiconductor integrated circuit according to the present invention, comprising: a buried insulation film formed in a substrate; a first metal layer formed on a top face of the buried insulation film; a vertical transistor having a channel body formed above the first metal layer and in a vertical direction of the substrate; and a gate formed by sandwiching the channel body from both sides in a horizontal direction of the substrate, or surrounding periphery of the channel body.

17 Claims, 17 Drawing Sheets

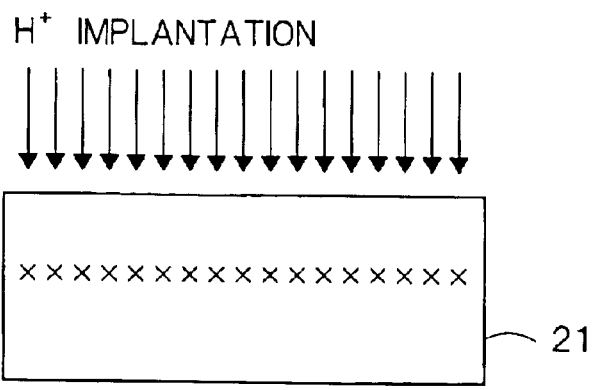
F I G. 6
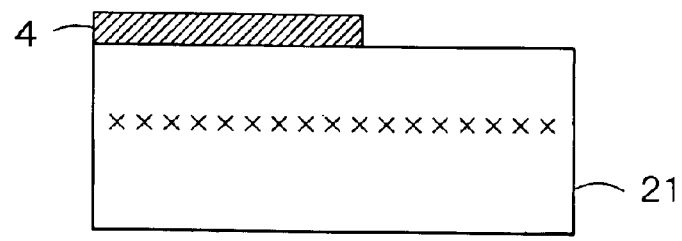
F I G. 7
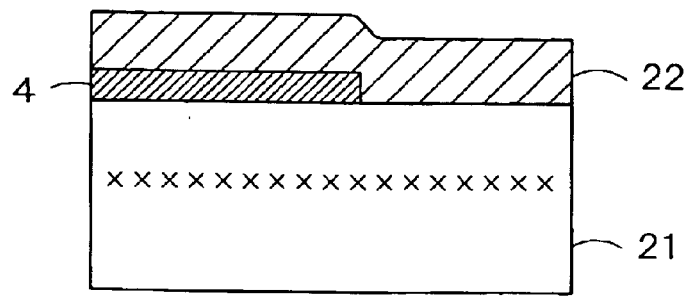
F I G. 8

PLANARIZATION

BONDING OF THE WAFER A TO THE WAFER B

CLEAVING AND POLISHING
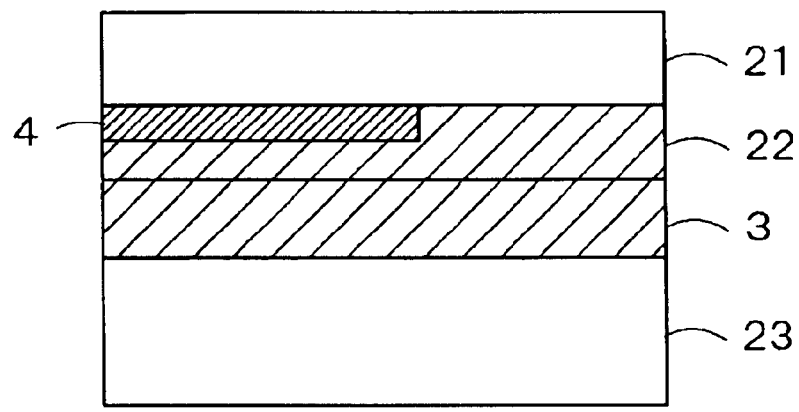
F I G. 12
ETCHING
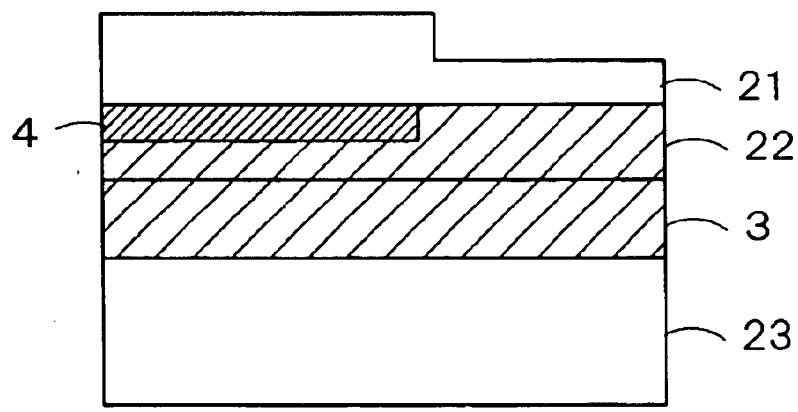
F I G. 13

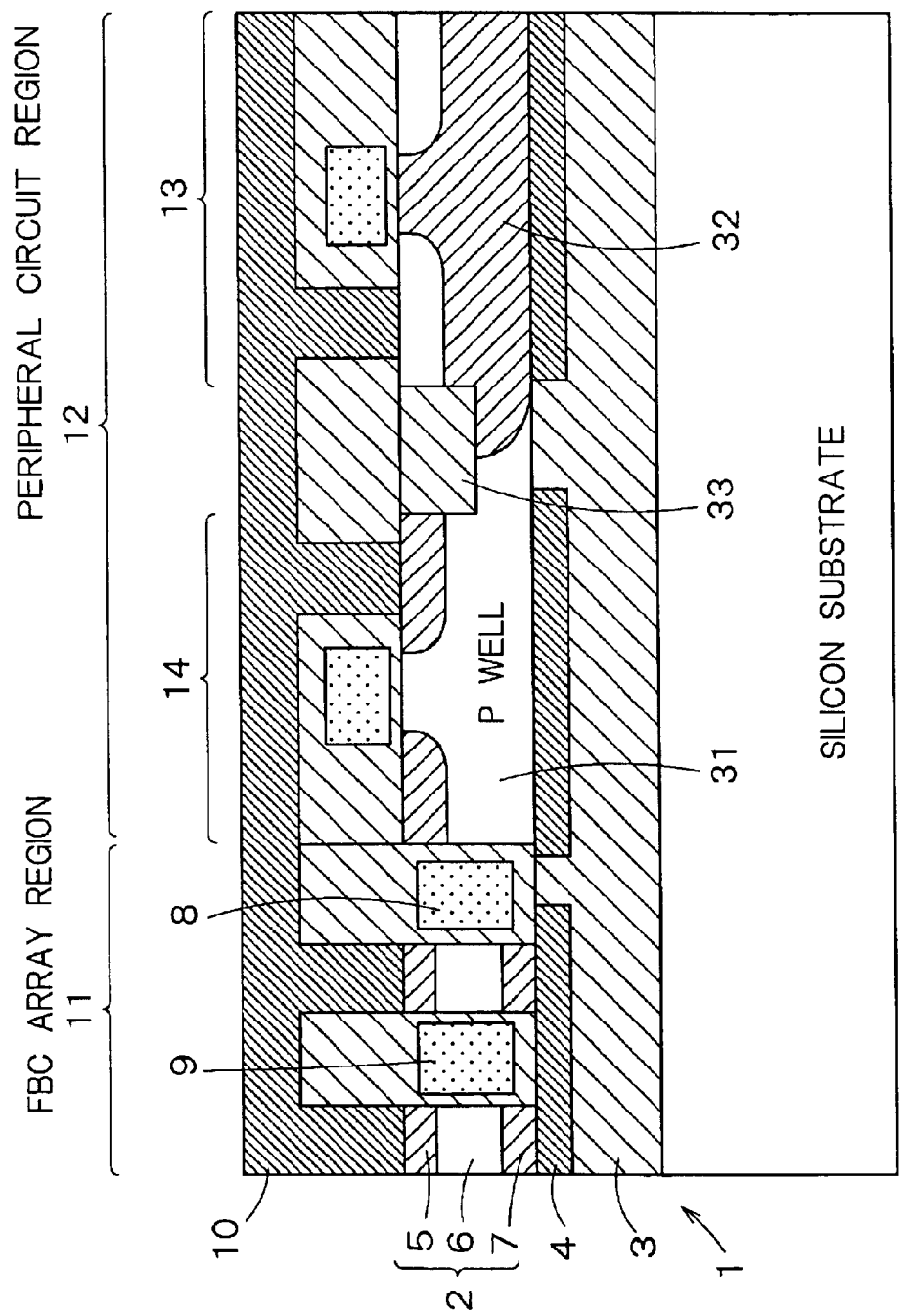
F I G. 15

SEMICONDUCTOR STORAGE DEVICE AND SEMICONDUCTOR INTEGRATED CIRCUIT

CROSS REFERENCE TO RELATED APPLICATIONS

This application claims benefit of priority under 35USC § 119 to Japanese Patent Application No. 2003-188539, filed on Jun. 30, 2003, the entire contents of which are incorporated by reference herein.

BACKGROUND OF THE INVENTION

1. Field of the Invention

The present invention relates to a semiconductor storage device and a semiconductor integrated circuit each having a vertical transistor.

2. Related Art

It is concerned that as a DRAM cell constructed by a conventional one transistor and one capacitor having a trench capacitor or a stacked capacitor is becoming smaller, it becomes difficult to fabricate the DRAM cell. As a memory cell which can replace the DRAM cell of this kind, a new memory cell, an FBC, for storing information by accumulating majority carriers in a floating body of an FET formed on a silicon on insulator (SOI) or the like has been proposed (refer to Japanese Patent Application Laid-Open Nos. 2003-68877 and 2002-246571).

As a technique of forming an FBC on a normal bulk silicon wafer without using an SOI wafer, a technique using a transistor (SGT) in which a silicon pillar is surrounded by a gate has been proposed. In the FBC of this kind, the height direction of the silicon pillar corresponds to length L of a channel. Even when the cell is formed finer, the length L can be made longer than that of a plane transistor. There is consequently an advantage such that a relatively thick gate insulating film can be used. In addition, a relatively high body impurity concentration can be set, so that the technique also has advantages such as an increased signal amount and longer data holding time.

The conventional FBC, however, has a drawback such that operation tends to become unstable due to high parasite resistance of a source, and the FBC is subjected to disturbance of "1" by a parasitic bipolar device.

The phenomenon that "operation becomes unstable due to parasitic resistance" is described as follows. At the time of writing "1", a transistor is operated in a pentode region. For example, when a word line is operated with 1.5V and a bit line is operated also with 1.5V, Vgs of 1.5V and Vds of 1.5V are applied. Under such conditions, a drain current Ids of about 15 μA flows. Therefore, when a source resistance is about 10 KΩ or higher, a voltage drop of about 150 mV or larger occurs. Although the user intends to apply Vds of 1.5V, substantially, about 1.35V or less is applied on the FBC transistor. A hole generation current due to impact ionization decreases and the speed of writing "1" deteriorates very much.

On the other hand, at the time of writing "0", when a word line is operated with 1.5V and a bit line is operated with −1.5V, Vgs of 3V and Vds of 1.5V are applied. Under the conditions, the drain current of about 50 μA flows. Therefore, when resistance of a source is about 10 KΩ or higher, a voltage drop of about 500 mV or higher occurs. Even when the voltage of the bit line is decreased to −1.5V, about −1V or higher is applied to the FBC transistor. Therefore, since the level of writing "0" is too high, only insufficient data "0" can be written.

FIG. 22 is a cross section view of a conventional semiconductor storage device having an FBC which is consisted of a vertical transistor. An FBC 70 in FIG. 22 has an N-type diffusion layer 73 disposed via a source face 72 on a silicon wafer 71, a silicon pillar 74 formed on the top face of the N-type diffusion layer 73, and an N-type diffusion layer 75 formed on the top face of the silicon pillar 74.

Cells A and B in FIG. 22 share a bit line 76 made of a metal material. On the right and left sides of the silicon pillar 74 of the FBC 70, gates made of polysilicon are formed. One of the gates is connected to a word line 77 and the other gate is connected to a plate line 78.

Since the plate line 78 is set to a minus potential and the silicon pillar 74 of the FBC 70 is formed of a P-type diffusion layer, the interface between the plate line 78 and the silicon pillar 74 is in a hole accumulation state and a predetermined capacity is assured.

It is assumed here that, in the initial state, both of cells A and B are in a "0" state, that is, in a state where the number of holes is small. A situation of writing data "1" into the cell A in this state will be considered. In the situation, the voltage of the word line 77 belonging to the cell A (left word line 77) is increased to 1.5V and the voltage of the bit line is also increased to 1.5V.

In such a state, the cell A operates in the pentode region, electron-hole pairs are generated from a pinch-off point near the drain, and the holes start to be accumulated in the body. Accordingly, the body potential starts rising. When the body potential is raised to a turn-on voltage Vf of a PN junction, as shown in FIG. 23, a current in the PN junction increases, and a part of the holes generated in the body flow out toward the N-type diffusion layer 73 of the source.

Although the ratio of the holes which flow to the N-type diffusion layer 73, re-combine with the electrons and disappear is high, there is probability that a part of the holes is not recombined but is diffused into the diffusion layer 72, passes under the adjacent cell B, and enters the body of the cell B of low potential. It means that, in such a situation, the cell B in which data of "0" is originally written (specifically, a storage state as a state where the number of holes in the body of the cell B is small is held) changes to the state of "1".

Therefore, when an event of continuously writing "1" into the cell A for a long time, or an event of writing "1" a number of times though each writing period is short occurs, an inconvenience such that the cell B is changed to "1" arises. This inconvenience is disturbance of "1". In other words, when "1" is written into a cell by the operation of a parasitic PNP bipolar in which the body of the cell A is an emitter, the body of the cell B is a collector, and the diffusion layer 72 between the cells A and B serves as a base, an inconvenience such that a neighboring "0" cell is changed to a "1" cell occurs.

SUMMARY OF THE INVENTION

A semiconductor integrated circuit according to an embodiment of the present invention, comprising:

a buried insulation film formed in a substrate;

a first metal layer formed on a top face of said buried insulation film;

a vertical transistor having a channel body formed above said first metal layer and in a vertical direction of the substrate; and a gate formed by sandwiching said channel body from both sides in a horizontal direction of the substrate, or surrounding periphery of said channel body.

Furthermore, a semiconductor storage device according to an embodiment of the present invention, comprising:

a buried insulation film formed in a substrate;

an FBC (Floating Body Cell) having a channel body which extends in a vertical direction of the substrate and a gate formed to sandwich said channel body from both sides in a horizontal direction of the substrate, which is formed above said buried insulation film and stores information by accumulating a majority carrier into said channel body; and a first metal layer formed between said buried insulation film and said FBC.

BRIEF DESCRIPTION OF THE DRAWINGS

FIG. 6 is a process drawing showing a process of fabricating the semiconductor storage device of the embodiment.

FIG. 7 is a process drawing following from FIG. 6.

FIG. 8 is a process drawing following from FIG. 7.

FIG. 12 is a process drawing following from FIG. 11.

FIG. 13 is a process drawing following from FIG. 12.

FIG. 15 is a cross section in which a metal layer 4 is disposed between an NFET 14 and a buried oxide film 3 and the metal layer 4 is disposed between a PFET 13 and the buried oxide film 3.

DESCRIPTION OF THE PREFERRED EMBODIMENTS

A semiconductor storage device and a semiconductor integrated circuit according to the invention will be concretely described hereinbelow with reference to the drawings.

(First Embodiment)

Figure 1:
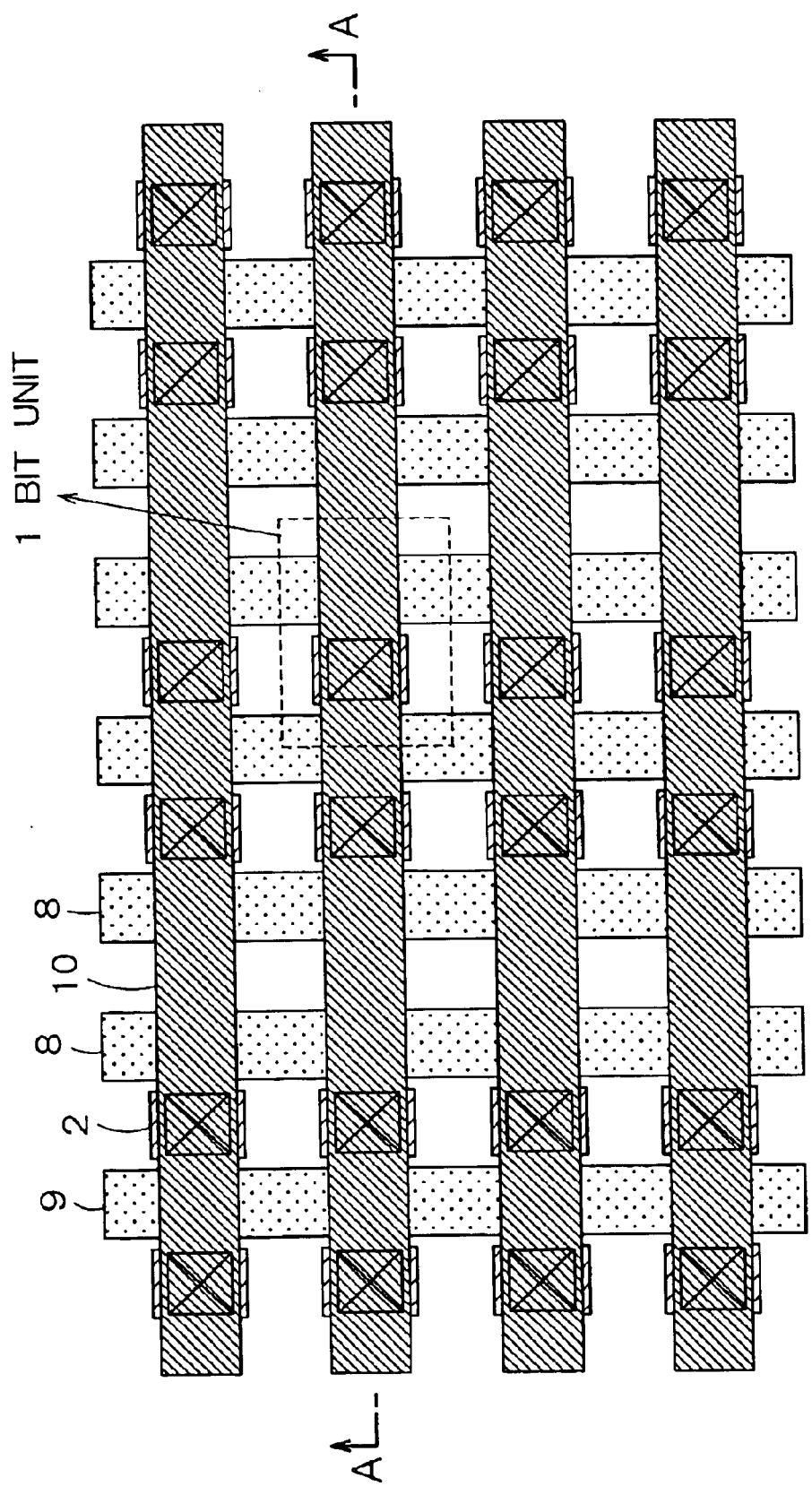
FIG. 1 is a plan view showing a first embodiment of a semiconductor storage device according to the invention.
Figure 2:
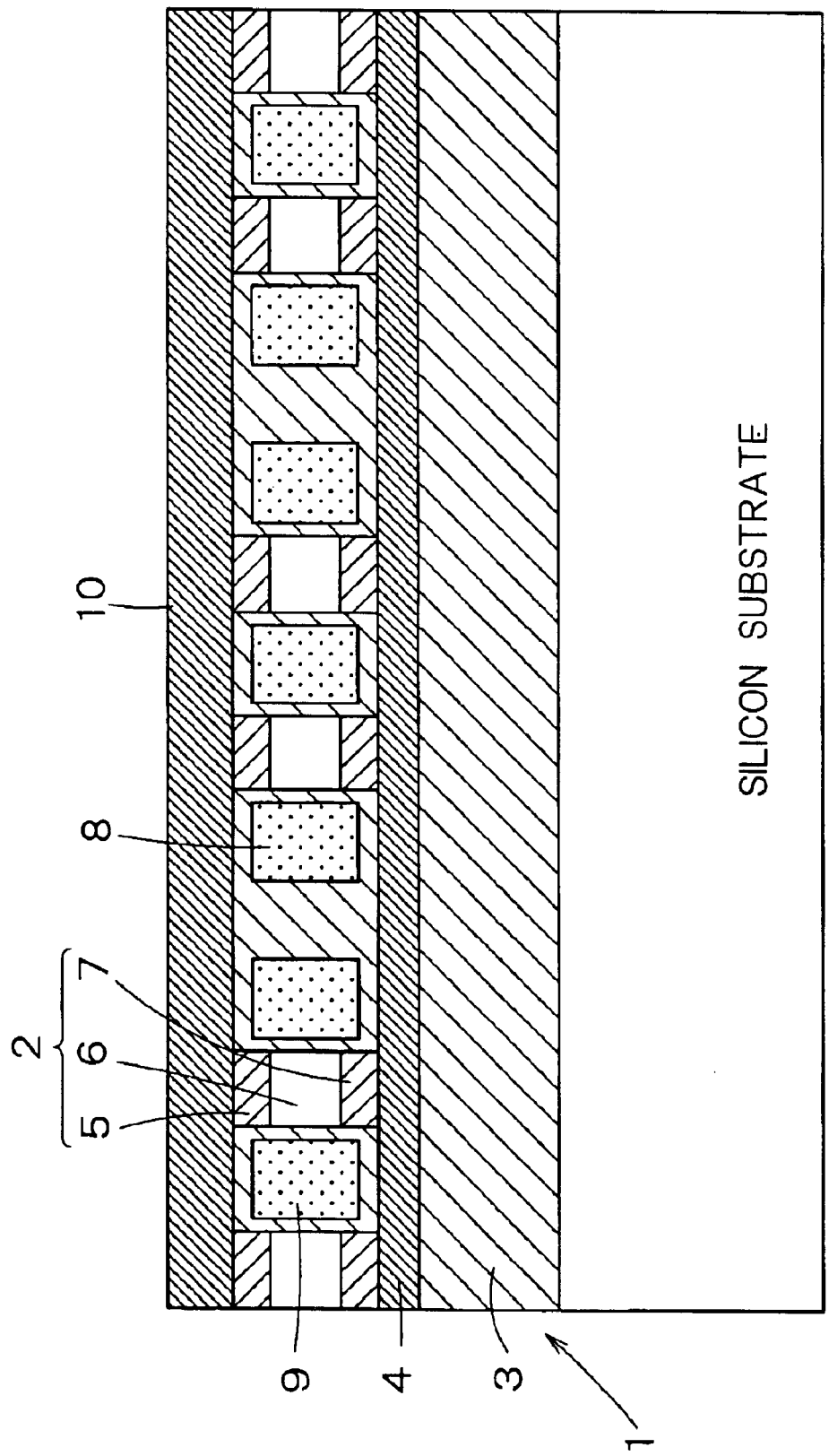
FIG. 2 is a cross section taken along line A—A of FIG. 1.
Figure 3:
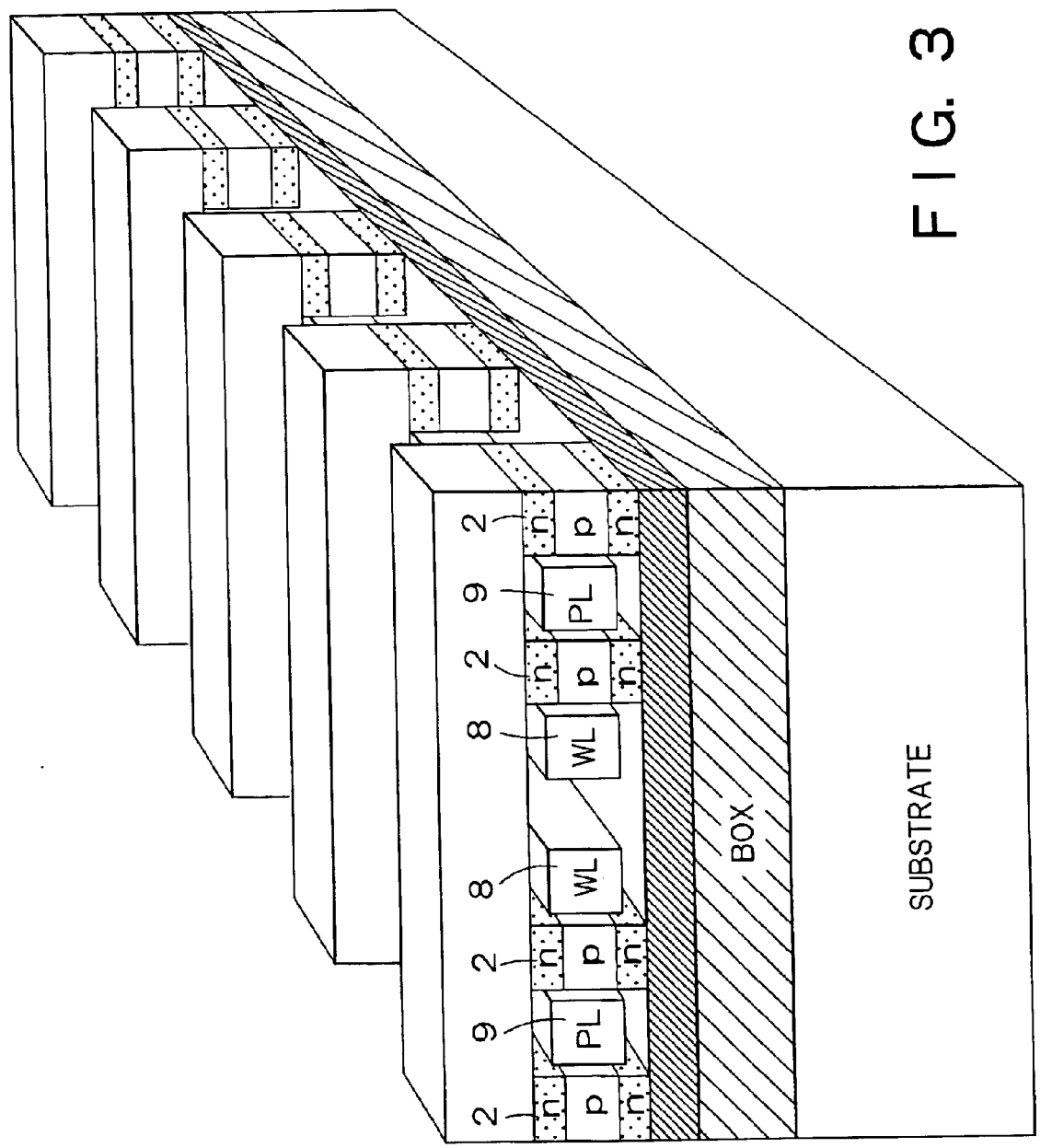
FIG. 3 is a schematic perspective view of FIG. 1.

FIG. 1 is a plan view showing a first embodiment of a semiconductor storage device according to the invention. FIG. 2 is a cross section view taken along line A—A of FIG. 1. FIG. 3 is a schematic perspective view of FIG. 1. A broken-line portion in FIG. 1 shows the configuration of one bit.

The semiconductor storage device of the embodiment is obtained by arranging FBCs 2 including vertical transistors in a matrix on an SOI wafer 1 and is characterized in that a metal layer 4 is formed between a buried oxide film 3 of the SOI wafer 1 and the FBC 2.

The vertical transistor of the FBC 2 has a channel body including an N-diffusion layer 5, a P-diffusion layer 6 and an N-diffusion layer 7 which are stacked in the vertical direction of the wafer and gates made of polysilicon which are formed on the right and left sides of the channel body. One of the gates are connected to a word line 8 and another thereof are connected to a plate line 9. The word line 8 is used to form a channel. A negative potential is applied to the plate line 9, thereby accumulating holes in the channel body and forming a capacitance.

Between the under faces of the FBC 2, the word line 8 and the plate line 9 and the buried oxide film 3, the above-described metal layer 4 (source plane) is formed. On the top faces of the FBC 2, word line 8, and plate line 9, a bit line 10 is disposed. A plurality of bit lines 10 are provided at predetermined intervals as shown in FIGS. 1 and 3.

Figure 4:
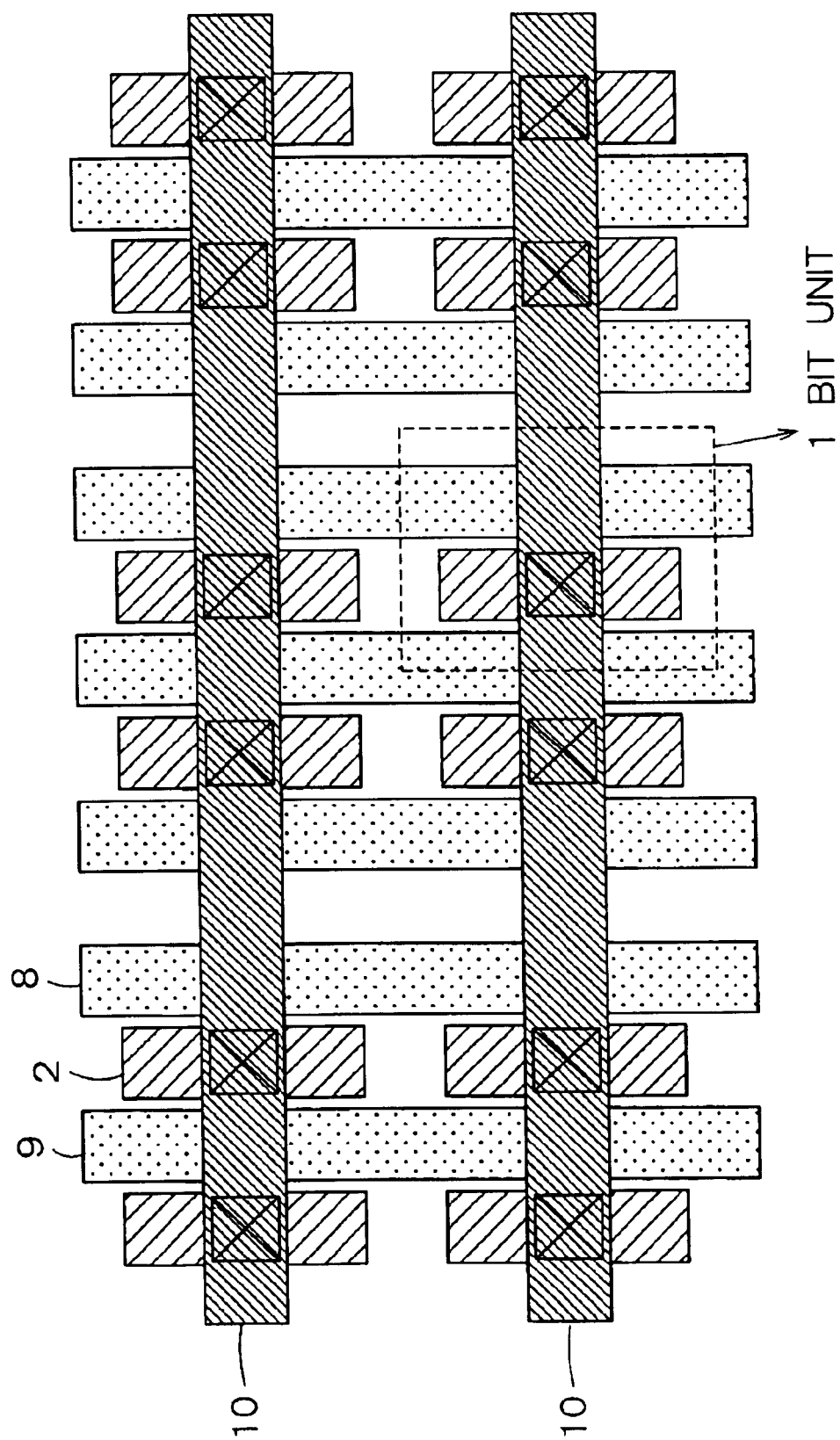
FIG. 4 is a plan view showing a state where the channel body is elongated in a channel width direction of a vertical transistor.

The channel body may be extended in the channel width direction of the vertical transistor as shown in FIG. 4, thereby increasing a read current and realizing high-speed reading. To increase the channel length, it is sufficient to increase the height of the channel body.

In the first embodiment, the metal layer 4 is disposed on the under faces of the FBC 2, word line 8, and plate line 9, so that resistance of the source plane of the FBC 2 can be sufficiently decreased. Therefore, the drawback as a problem of the conventional technique such that operation becomes unstable due to parasitic resistance can be solved with reliability. Since the metal layer 4 exists between neighboring cells, holes released from the cells into the N-diffusion layer 7 are easily recombined with electrons in the metal layer 4. There is consequently no possibility that holes reach the N-diffusion layer 7 in the adjacent cell. Thus, the problem such that the FBC is subjected to disturbance of "1" by a parasitic bipolar device can be perfectly avoided.

Figure 5:
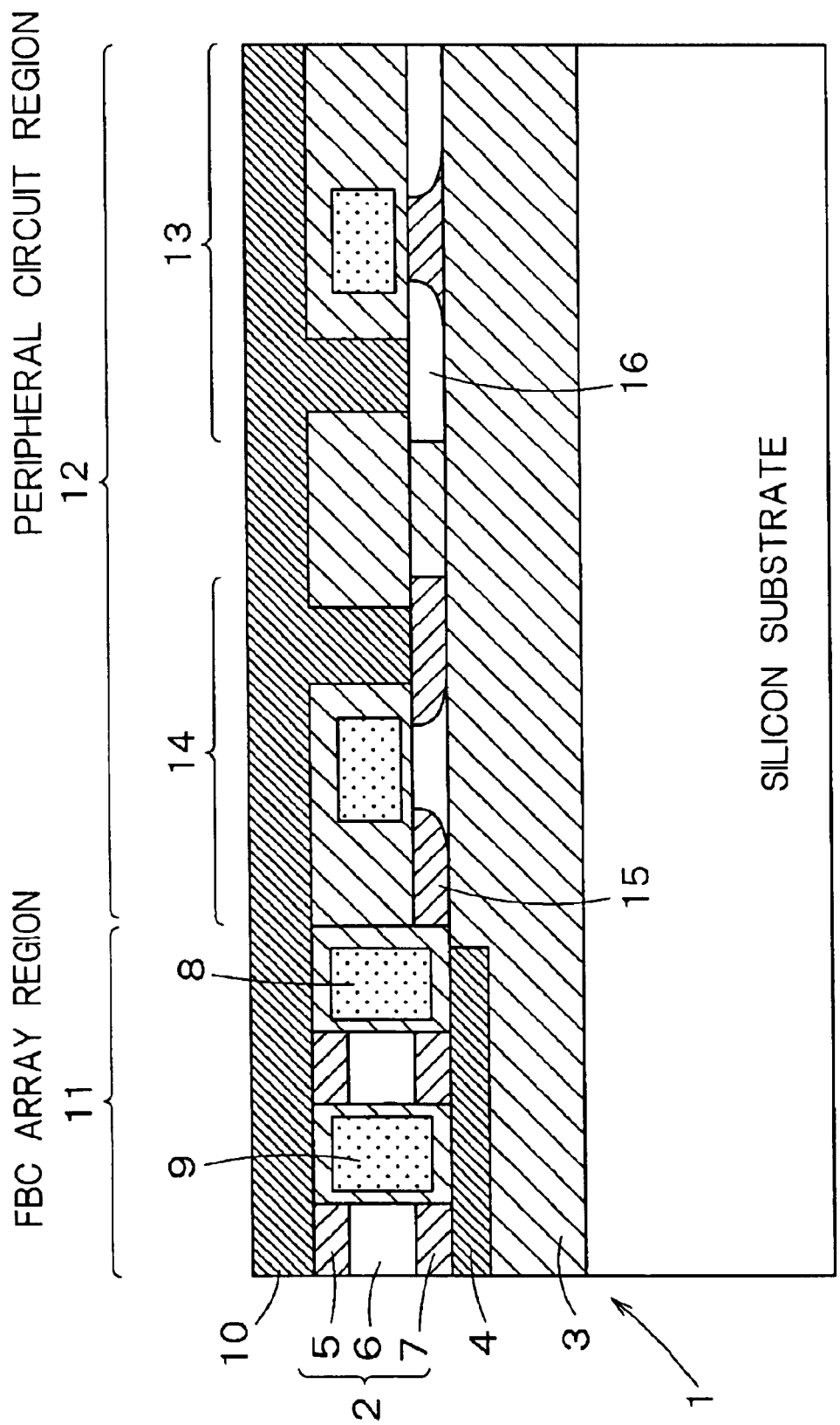
FIG. 5 is a cross section of a junction portion between an FBC array region 11 in which FBCs 2 are formed in an array and a peripheral circuit region 12 in which a peripheral circuit is formed.

FIG. 5 is a cross section view of a junction portion between an FBC array region 11 in which the FBCs 2 are formed in an array and a peripheral circuit region 12 in which peripheral circuits are formed. The peripheral circuit region 12 in which a P-type MOSFET (hereinbelow, PFET) 13 and an N-type MOSFET (hereinbelow, NFET) 14 are isolated from each other by an insulation film is formed on the buried oxide film 3 of the SOI wafer 1. Each of the PFET 13 and the NFET 14 is not a vertical transistor but a lateral plane transistor. The gates of the PFET 13 and NFET 14 are made of polysilicon, the source and drain regions of the NFET 14 are formed by an N diffusion layer 15, and the source and drain regions of the PFET 13 are formed by a P diffusion layer 16.

The metal layer 4 does not exist between the peripheral circuits and the buried oxide film 3. The height of the gate in the peripheral circuit region 12 is lower than that of the polysilicon region of the word line 8 and the plate line 9 in the FBC array region 11.

With the configuration, the source and drain of the plane transistor can be formed in the peripheral circuit region 12 without electrically short-circuiting the source and drain. The bit line 10 in the FBC array region 11 can be extended on the peripheral circuit region 12 without changing the height. The peripheral circuit region 12 can use the bit line 10 as a wiring region.

Figure 9:
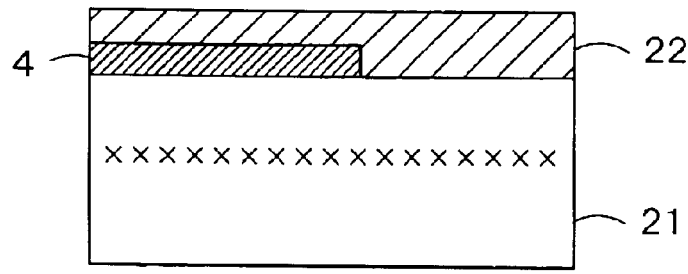
FIG. 9 is a process drawing following from FIG. 8.

FIGS. 6 to 13 are process drawings each showing a fabricating process of the semiconductor storage device of the embodiment, which is formed by using two wafers 21 and 23. First, as shown in FIG. 6, hydrogen ions are implanted into the wafer 21. After that, as shown in FIG. 7, the metal 4 is deposited on the surface and patterned by using a mask. Subsequently, as shown in FIG. 8, a thick oxide film 22 is deposited. As shown in FIG. 9, the surface is planarized.

Figure 10:
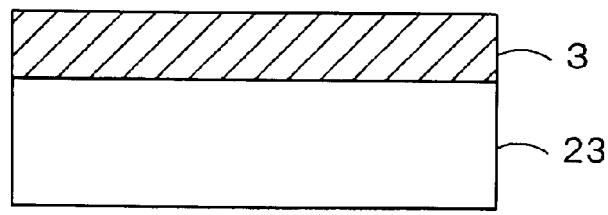
FIG. 10 is a process drawing following from FIG. 9.
Figure 11:
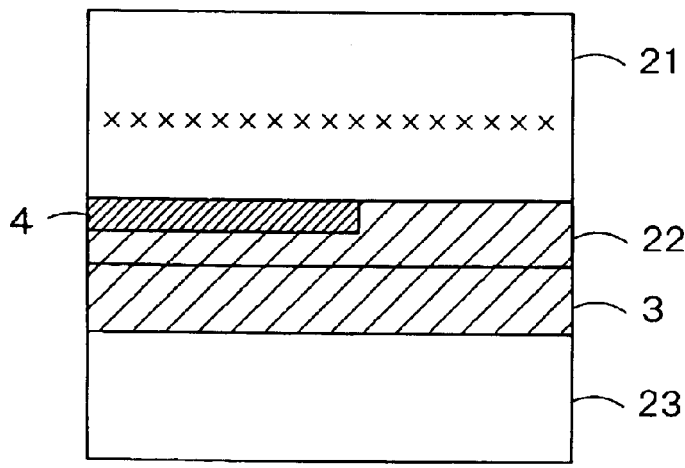
FIG. 11 is a process drawing following from FIG. 10.

On the other hand, as shown in FIG. 10, the oxide film 3 is deposited on the surface of the wafer 23. As shown in FIG. 11, the wafer 21 is bonded to the wafer 23 in such a manner that the oxide films 3 and 22 face each other. The silicon in an upper portion from the face in which hydrogen ions were implanted is removed and the surface of the remaining silicon is polished as shown in FIG. 12. Subsequently, as shown in FIG. 13, a region in which the metal 4 is not deposited, that is, the peripheral circuit region 12 is etched and removed by using a mask.

The method of removing silicon from the face in which hydrogen ions are implanted is well known as a smart-cut process (J-P Colinge: "Silicon-On-Insulator Technology: Materials to VLSI", 2nd Edition, Kluwer Academic Publishers, P. 50, 1997).

As described above, in the first embodiment, the metal layer 4 is formed between the FBC 2 and the buried oxide film 3, so that the parasitic resistance of the source can be reduced and the FBC 2 having excellent characteristics, which is not influenced by disturbance of "1" by a parasitic bipolar device can be obtained.

(Second Embodiment)

A second embodiment relates to a structure of the case where a silicon film in which channel, source, and drain regions of a peripheral circuit are formed is thick.

Figure 14:
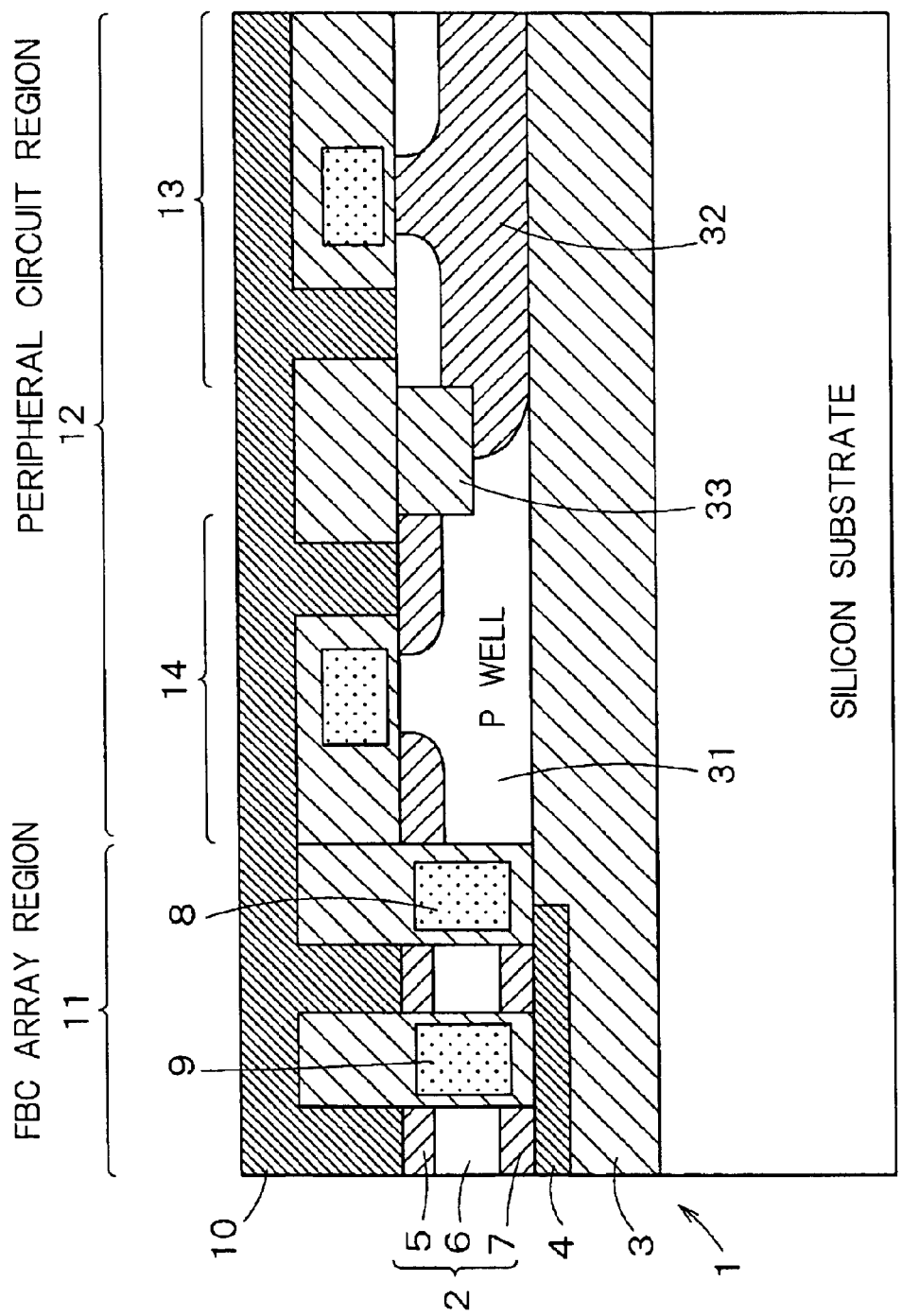
FIG. 14 is a cross section showing a second embodiment of a semiconductor storage device according to the invention.

FIG. 14 is a cross section showing a second embodiment of a semiconductor storage device according to the invention. In the semiconductor storage device of FIG. 14, a P-well region 31 of the NFET 14 and an N-well region 32 of the PFET 13 in the peripheral circuit region 12 are thicker than those in FIG. 5. In this case as well, the metal layer 4 is provided only in the lower portion of the FBC array region 11. Between the P-well region 31 and the N-well region 32, an STI (Shallow Trench Isolation) region 33 is provided.

Alternately, as shown in FIG. 15, the metal layer 4 may be disposed between the NFET 14 and the buried oxide film 3, and the metal layer 4 may be also disposed between the PFET 13 and the buried oxide film 3. With this configuration, resistance to latch-up of a CMOS as a component of a peripheral circuit is improved.

(Third Embodiment)

A third embodiment relates to a structure of a case where an N-well region of the PFET 13 in the peripheral circuit is shallow.

Figure 16:
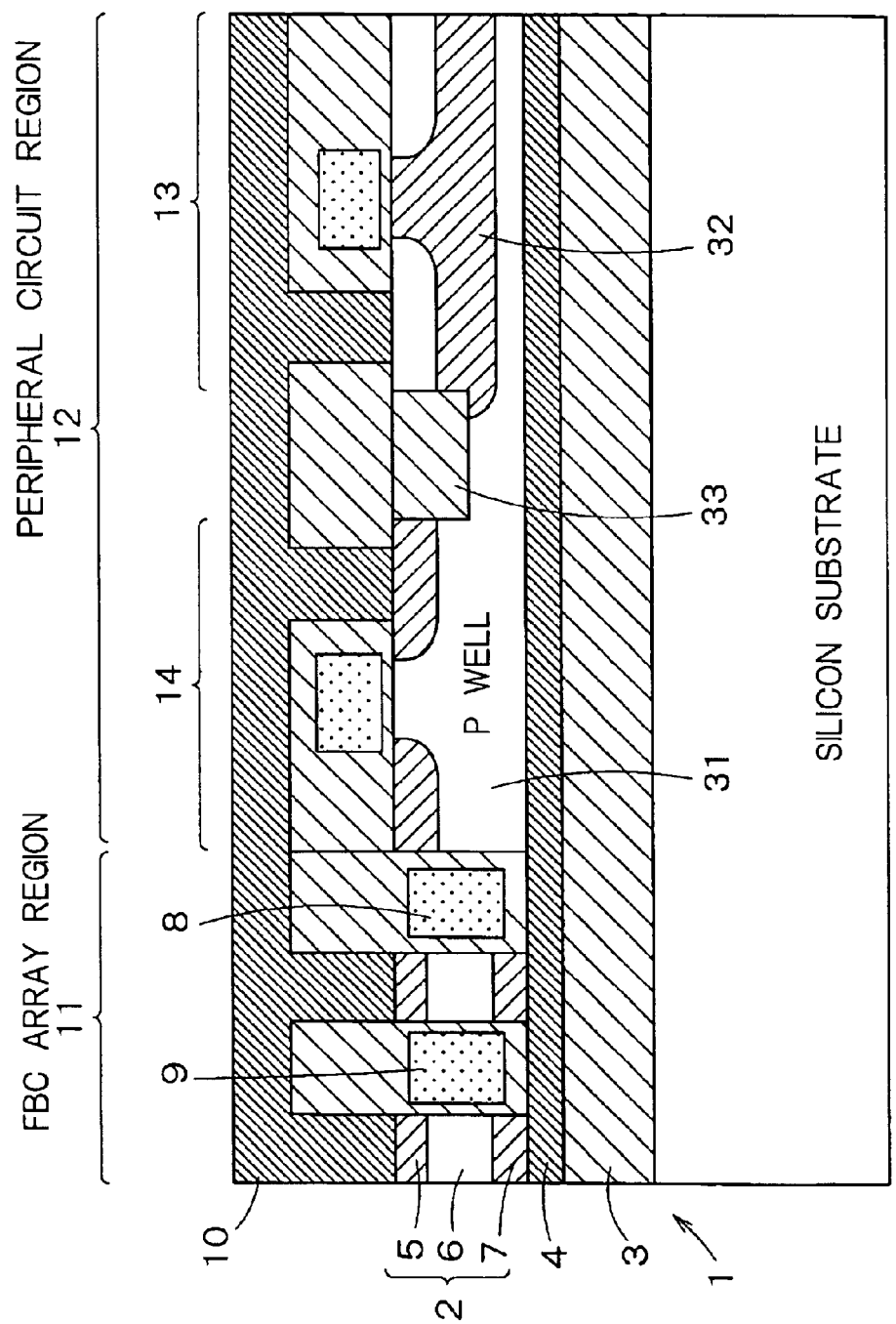
FIG. 16 is a cross section showing a third embodiment of a semiconductor storage device according to the invention.

FIG. 16 is a cross section showing the third embodiment of the semiconductor storage device according to the invention. In the semiconductor storage device of FIG. 16, the P-well region 31 in the NFET 14 extends below the N-well region 32 in the PFET 13.

In this case, it is unnecessary to pattern the metal layer 4 on the top face of the buried oxide film 3. The metal layer 4 may be extended to the peripheral circuit region 12.

With the configuration, the fabrication process is simplified, the SOI wafer 1 in which the metal layer 4 is buried in advance can be easily purchased from a material manufacturer, so that the material cost can be suppressed.

(Fourth Embodiment)

Although an example of forming the NFET 14 and the PFET 13 in the peripheral circuit region 12 of plane transistors has been described in the foregoing first to third embodiments, each of the NFET 14 and the PFET 13 may be formed of a vertical transistor. A sectional structure in this case is as shown in FIG. 17.

Figure 17:
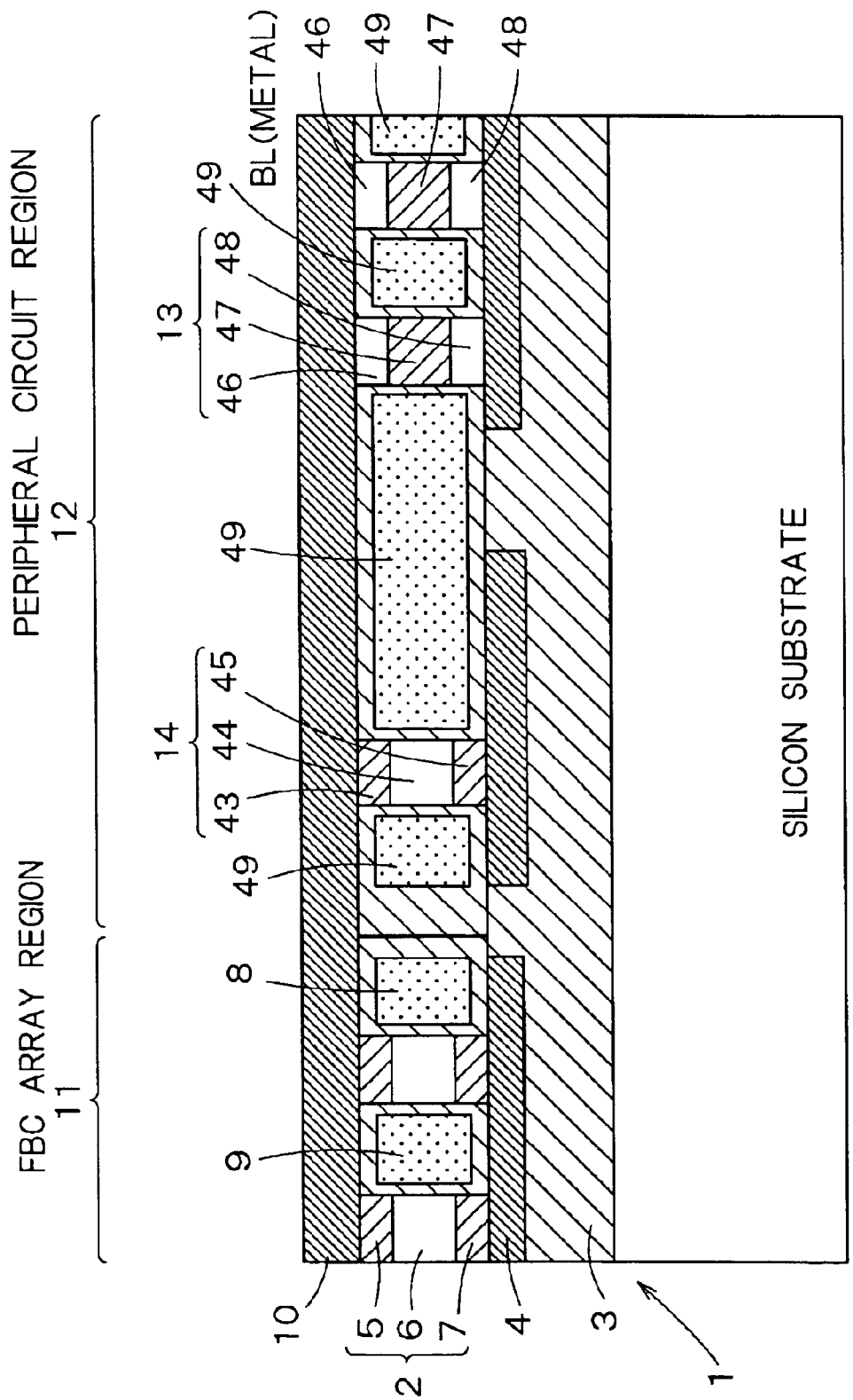
FIG. 17 is a cross section showing a case where a peripheral circuit is constructed by a vertical transistor.

In FIG. 17, the metal layer 4 formed on the top face of the buried oxide film 3 in the FBC array region 11 is isolated by the insulation film and is also disposed in the peripheral circuit region 12. In the peripheral circuit region 12, the metal layer 4 is used as a GND line of the NFET 14 and a power source line of the PFET 13.

The metal layer 4 can be also used as an intermediate node of a stacked transistor or a node of a transfer gate, i.e. wires other than a GND and a power supply line.

The NFET 14 in FIG. 17 is formed of an N-diffusion layer 43, a channel body 44, and an N-diffusion layer 45 which are stacked in the vertical direction of the wafer. Similarly, the PFET 13 is formed of a P-diffusion layer 46, a channel body 47, and a P-diffusion layer 48 which are stacked in the vertical direction of the wafer. The N-diffusion layer 43 and the P-diffusion layer 46 in the upper part of the NFET 14 and the PFET 13 are in contact with the bit line 10, and the N-diffusion layer 45 and P-diffusion layer 48 in the lower part of the NFET 14 and PFET 13 are in contact with the metal layer 4. For the NFET 14 and PFET 13, gates 49 made of polysilicon are disposed. The NFET 14 and PFET 13 are surrounded by the gates 49.

By forming the peripheral circuit by the vertical transistors, the peripheral circuit can be formed by the same process as that of the FBC 2. Thus, the fabrication process can be simplified.

(Fifth Embodiment)

In a fifth embodiment, a CMOS circuit having the NFET 14 and PFET 13 is formed of vertical transistors.

Figure 18:
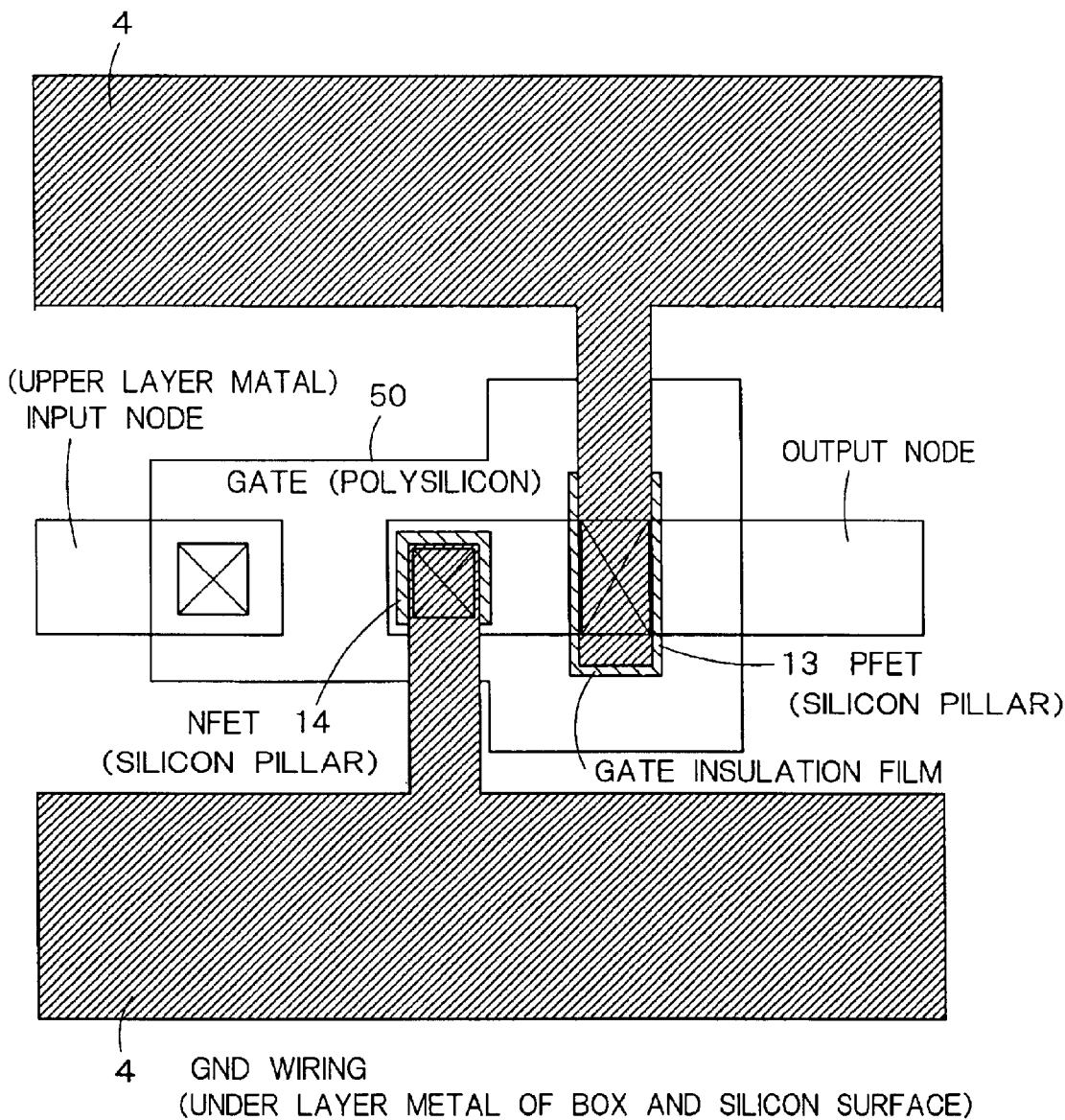
FIG. 18 is a plan view of an embodiment of the semiconductor integrated circuit.

FIG. 18 is a plan view showing an embodiment of a semiconductor integrated circuit. A CMOS transistor having the NFET 14 and PFET 13 is formed of a vertical transistor. In the example of FIG. 18, the NFET 14 uses the metal layer 4 on the buried oxide film 3 as a GND line and the PFET 13 uses it as a power source line Vcc. A wiring layer of the same height as that of the bit line 10 in the FBC 2 region is used as an input line and an output line of the peripheral circuit region 12.

As the gates of the NFET 14 and PFET 13, as shown in FIG. 18, a polysilicon layer 50 is shared by the NFET 14 and PFET 13. The polysilicon layer 50 surrounds the NFET 14 and PFET 13. Although not shown in FIG. 18, the potential of the metal layer 4 is set by a contact extending upward from the metal layer 4.

As described above, according to the fifth embodiment, the metal layer 4, polysilicon layer 50, and bit line 10 can be shared by the peripheral circuit region 12, so that the embodiment is effective as a general wiring technique of a vertical transistor irrespective of the presence or absence of the FBC 2.

Figure 19:
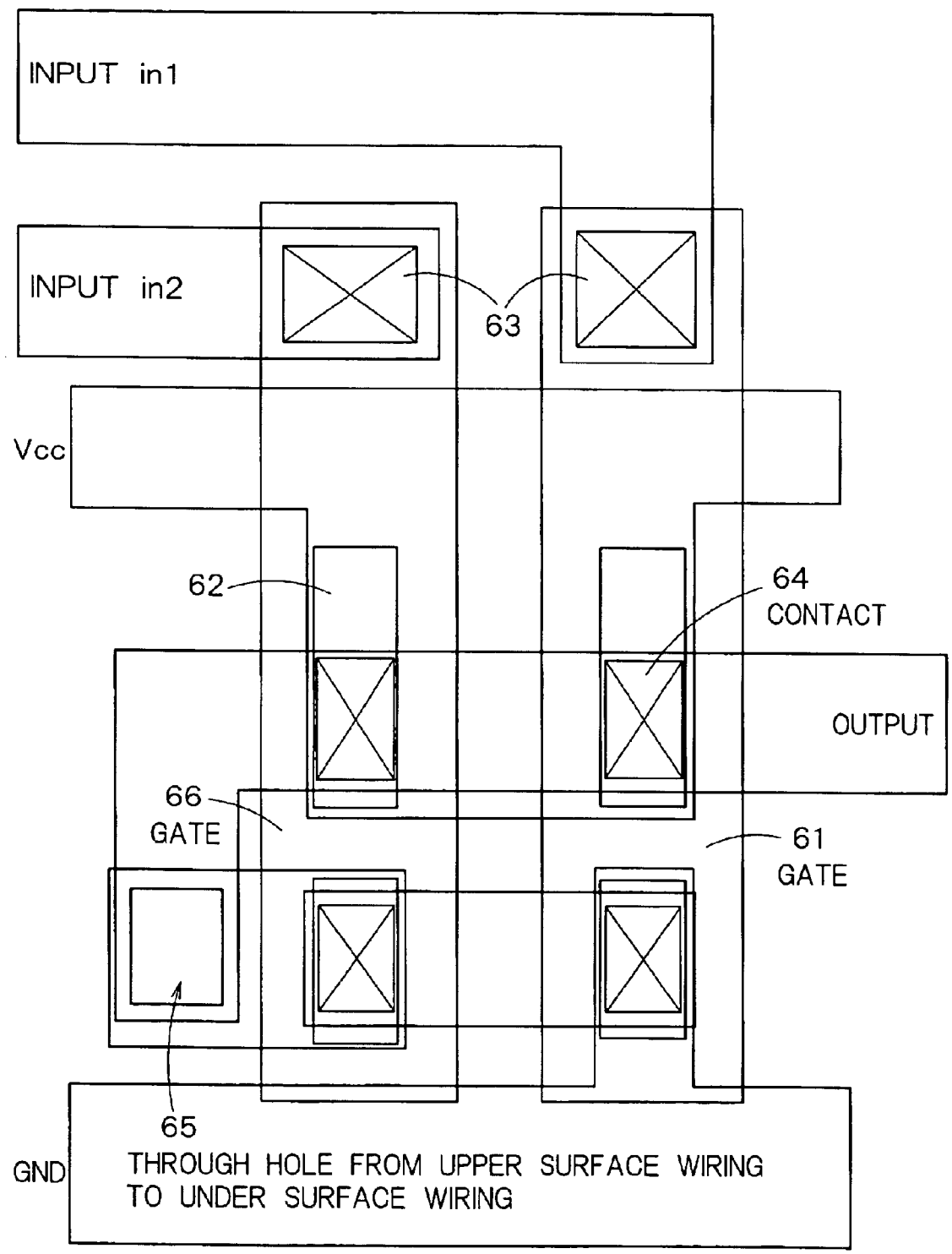
FIG. 19 is a plan view showing a case where a CMOS-NAND circuit having two inputs is realized by a vertical transistor.

FIG. 19 is a plan view of a case where a CMOS-NAND circuit having two inputs is realized by using vertical transistors. The circuit of FIG. 19 has gate electrodes 61 and 66, the power source line Vcc, the GND line, input lines in1 and in2, an output line OUT, a channel body 62 of the NFET 14 and PFET 13, a contact 63 for connecting the input line to the gate, a contact 64 for connecting the channel body 62 to the output line, and a through hole 65 for connecting wirings on the top face and the under face of the silicon layer.

As described above, according to the fifth embodiment, the CMOS circuit can be formed of the channel body 62 of the NFET 14 and the PFET 13, the gate electrode 61 and 66 insulated by the gate insulation film surrounding the channel body 62, the wiring layers Vcc and GND on the under face side of the channel body 62, and the wiring layer on the top face side of the channel body 62, so that the structure can be simplified.

(Sixth Embodiment)

In a sixth embodiment, in addition to the word line 8, a back-side word line is provided.

Figure 20:
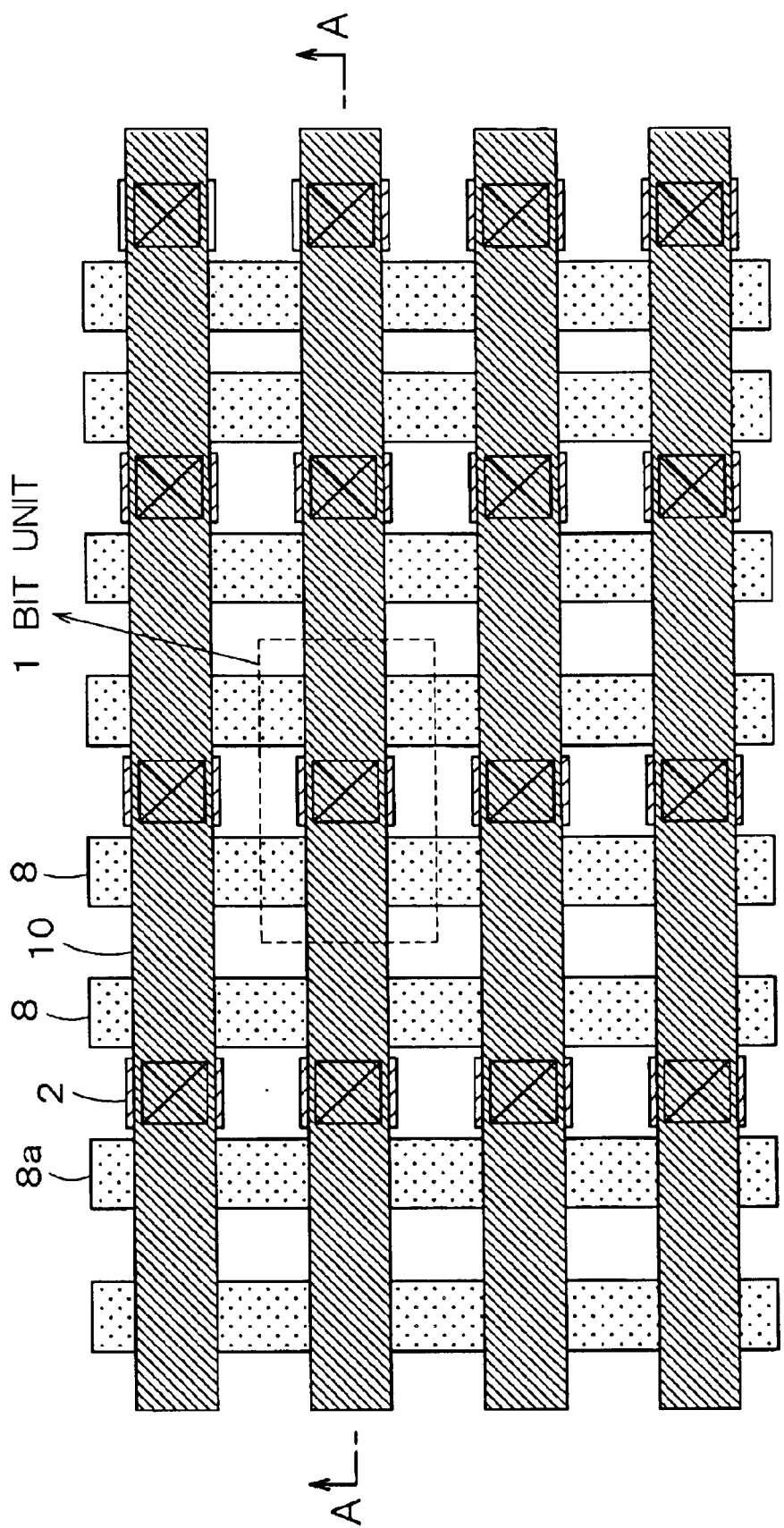
FIG. 20 is a plan view showing a sixth embodiment of a semiconductor storage device according to the invention.
Figure 21:
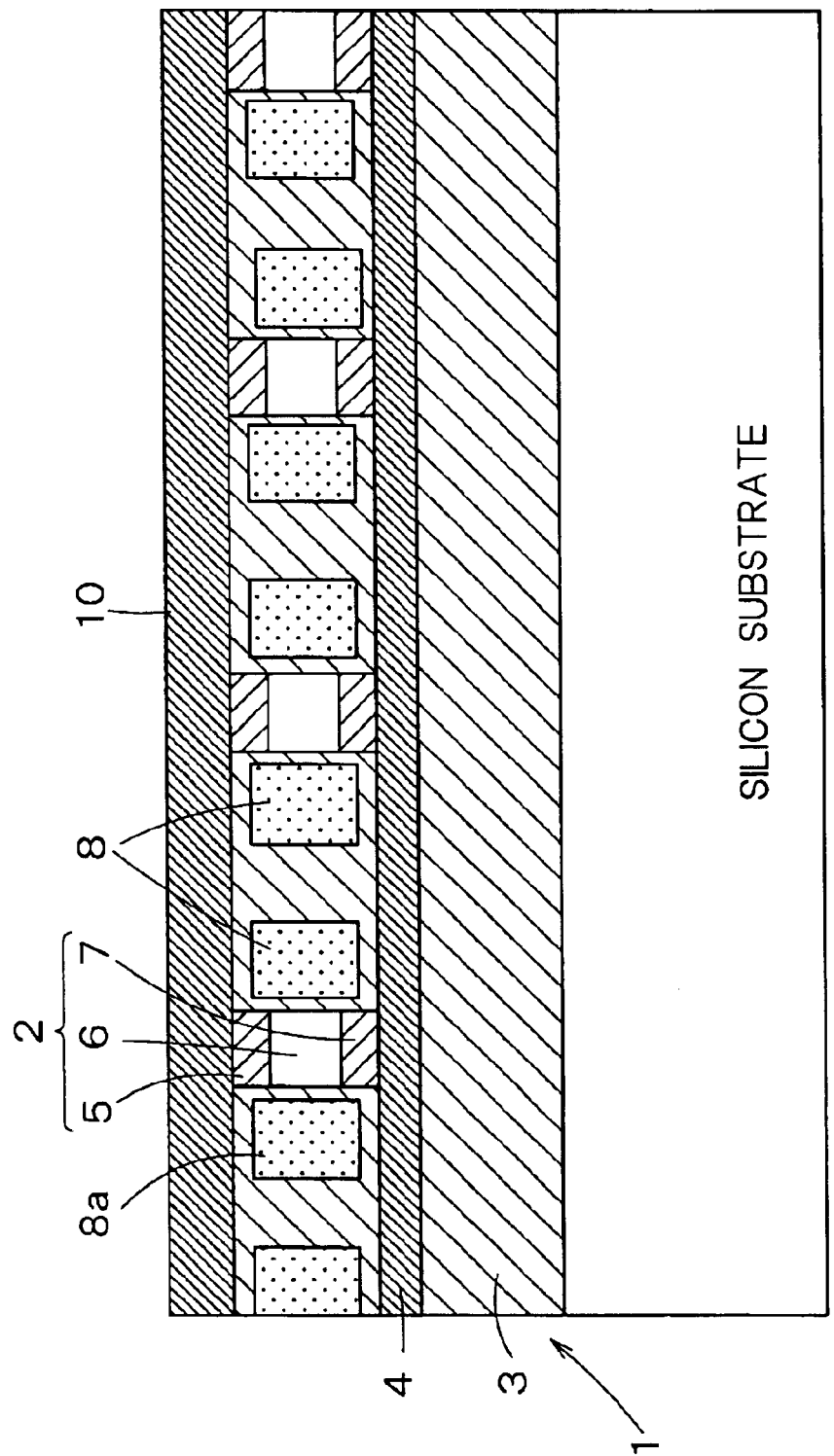
FIG. 21 is a cross section taken along line A—A of FIG. 20.
Figure 22:
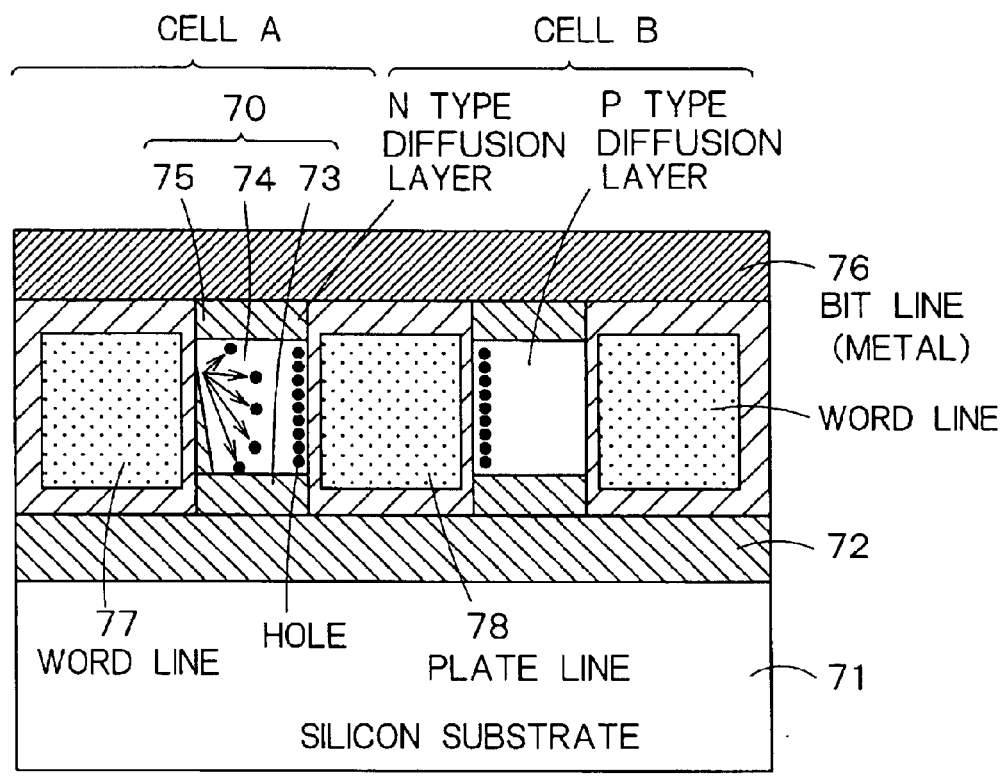
FIG. 22 is a cross section of a conventional semiconductor storage device having an FBC constructed by a vertical transistor.
Figure 23:
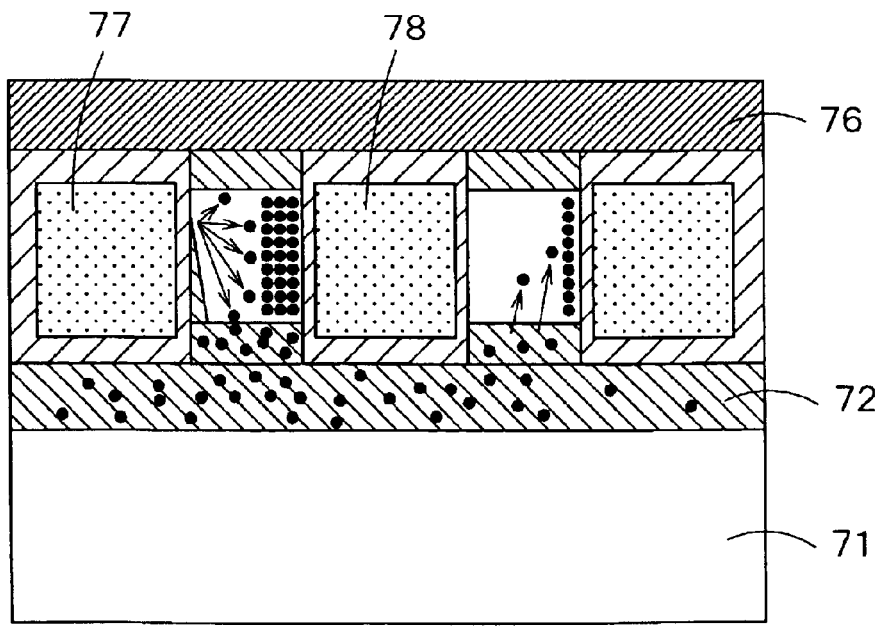
FIG. 23 is a diagram showing a state where holes are accumulated in the structure of FIG. 22.

FIG. 20 is a plan view showing the sixth embodiment of the semiconductor storage device according to the invention. FIG. 21 is a cross section view taken along line A—A of FIG. 20. A broken line of FIG. 20 shows the configuration of one bit.

The semiconductor storage device of FIG. 21 has a back-side word line 8a in place of the plate line 9 in FIG. 2. On both sides of the channel body of the FBC 2, the word line 8 and the back-side word line 8a are disposed. That is, the channel body of the FBC 2 is sandwiched with the word line 8 and the back-side word line 8a.

The amplitude of the word line 8 lies in a range, for example, from −0.5V (at the time of data holding) to 1.5V (at the time of writing and reading). On the other hand, the amplitude of the back-side word line 8a lies in a range, for example, from −1.5V (at the time of data holding) to 0.5V (at the time of writing and reading). As described above, the amplitude of the back-side word line 8a is set to be lower than the amplitude of the word line 8 only by an amount of the offset voltage.

Alternately, the type of an impurity implanted in the polysilicon of the word line 8 is the N type, the type of an impurity implanted in the polysilicon of the back-side word line 8a is the P type, and the back-side word line 8a may be driven with the same amplitude as that of the word line 8, which lies in the range from −0.5V (at the time of data holding) to 1.5V (at the time of writing/reading) without the offset.

When the polysilicon is made to the P type by ion implantation, by the difference (about 1V) between the work function of the P-type silicon and the work function of the N-type silicon, the threshold voltage by the back-side word line 8a becomes higher than the threshold voltage by the word line 8 by about 1V. With the configuration, substantially the same effects as those in the case where an offset of −1V is provided can be obtained. The word line 8 and the back-side word line 8a operate with the same phase and the same amplitude.

The technique of providing the back-side word line 8a has already been proposed (Japanese Patent Application Laid-Open No. 2003-86712). By such a series of techniques, the channel body of the FBC 2 can be coupled to the back-side word line 8a with the almost same linear capacitance, and the level at the holding time of the word line 8 can be set to be shallow.

Thus, the invention is advantageous to situations such as deterioration in the gate insulator breakdown voltage and in retention time by GIDL. The structure of the peripheral circuit can be variously modified in a manner similar to the first embodiment.

What is claimed is:

1. A semiconductor integrated circuit, comprising:
    a buried insulation film formed in a substrate;
    a first metal layer formed on a top face of said buried insulation film;
    a vertical transistor having a channel body formed above said first metal layer and in a vertical direction of the substrate; and a gate formed by sandwiching said channel body from both sides in a horizontal direction of the substrate or surrounding a periphery of said channel body.

2. The semiconductor integrated circuit according to claim 1, wherein said vertical transistor is consisted of a PMOSFET and an NMOSFET; and
    said first metal layer is formed below said PMOSFET and said NMOSFET.

3. The semiconductor integrated circuit according to claim 2, wherein said first metal layer is formed of second and third metal layers formed separate from each other via an insulation film;
    said second metal layer is formed between said PMOSFET and said buried insulation film; and
    said third metal layer is formed between said NMOSFET and said buried insulation film.

4. A semiconductor storage device, comprising:
    a buried insulation film formed in a substrate;
    an FBC (Floating Body Cell) having a channel body which extends in a vertical direction of the substrate and a gate formed to sandwich said channel body from both sides in a horizontal direction of the substrate, said FBC formed above said buried insulation film and configured to store information by accumulating a majority carrier into said channel body; and
    a first metal layer farmed between said buried insulation film and said FBC.

5. The semiconductor storage device according to claim 4, further comprising a logic circuit formed in a horizontal direction of the substrate with regard to said FBC, which transfers a signal for said FBC.

6. The semiconductor storage device according to claim 5, wherein said logic circuit is formed to contact a top face of said buried insulation film.

7. The semiconductor storage device according to claim 5, wherein said logic circuit is a CMOS circuit having a PMOSFET and an NMOSFET; and
    said first metal layer is formed extending between said PMOSFET and said buried insulation film, and between said NMOSFET and said buried insulation film.

8. The semiconductor storage device according to claim 7, wherein said NMOSFET has a P type well region in which a channel is formed;
    said PMOSFET has an N type well region in which a channel is formed; and
    said first metal layer is formed extending between said PMOSFET and said buried insulation film, and between said NMOSFET and said buried insulation film, when at least one of said P type well region and said N type well region does not contact said buried insulation film.

9. The semiconductor storage device according to claim 5, wherein said logic circuit has a vertical transistor having a channel body extending in a vertical direction of the substrate; and further comprising a second metal layer formed between a vertical transistor of said logic circuit and said buried insulation film.

10. The semiconductor storage device according to claim 5, wherein said logic circuit is a CMOS circuit having a PMOSFET and an NMOSFET, further comprising a second metal layer formed separate from each other between said PMOSFET and said buried insulation film, and between said NMOSFET and said buried insulation film.

11. The semiconductor storage device according to claim 10, wherein said second metal layer is used as a ground line of the NMOSFET.

12. The semiconductor storage device according to claim 10, wherein said second metal layer is used as a power supply line of the PMOSFET.

13. The semiconductor storage device according to claim 4, wherein at least a first portion of the gate which sandwiches the channel body of said FBC from both sides in the horizontal direction of the substrate is a portion of word line, and at least a second portion of the gate is at least a portion of a plate line which sets a body potential of said FBC.

14. The semiconductor storage device according to claim 4, wherein at least a first portion of the gate which sandwiches the channel body of said FBC from both sides in the horizontal direction of the substrate is at least a portion of a word line, and at least a second portion of the gate is at least a portion of a back-side word line which operates in the same phase as that of said word line.

15. The semiconductor storage device according to claim 14, wherein said word line and said back-side word line are made of materials different from each other, and both word lines operate in the same phase.

16. The semiconductor storage device according to claim 15, wherein said word line and said back-side word line operate in the same amplitude.

17. The semiconductor storage device according to claim 14, wherein said back-side word line is made of a p-type polysilicon;

said word line is made of an n-type polysilicon; and both word lines operate in the same phase and the same amplitude.

* * * * *